(12) United States Patent
Satoh et al.

(10) Patent No.: US 8,536,063 B2
(45) Date of Patent: Sep. 17, 2013

(54) MRAM ETCHING PROCESSES

(75) Inventors: Kimihiro Satoh, Beaverton, OR (US);
Yiming Huai, Pleasanton, CA (US);
Jing Zhang, Los Altos, CA (US); Rajiv Yadav Ranjan, San Jose, CA (US);
Parviz Keshtbod, Los Altos Hills, CA (US); Roger K. Malmhall, San Jose, CA (US)

(73) Assignee: Avalanche Technology Inc., Fremont, CA (US)

( * ) Notice: Subject to any disclaimer, the term of this patent is extended or adjusted under 35 U.S.C. 154(b) by 126 days.

(21) Appl. No.: 13/199,490

(22) Filed: Aug. 30, 2011

(65) Prior Publication Data
US 2013/0052752 A1 Feb. 28, 2013

(51) Int. Cl.
*H01L 21/302* (2006.01)
*H01L 21/461* (2006.01)

(52) U.S. Cl.
USPC .................. 438/735; 438/737; 438/738

(58) Field of Classification Search
None
See application file for complete search history.

(56) References Cited

U.S. PATENT DOCUMENTS

| | | | |
|---|---|---|---|
| 6,475,857 B1* | 11/2002 | Kim et al. | 438/240 |
| 7,618,889 B2* | 11/2009 | Naik | 438/638 |
| 7,897,950 B2 | 3/2011 | Shoji | |
| 7,898,007 B2 | 3/2011 | Lee et al. | |
| 7,906,347 B2 | 3/2011 | Sato | |
| 7,919,794 B2 | 4/2011 | Gu et al. | |
| 7,919,826 B2 | 4/2011 | Iwayama et al. | |
| 7,936,027 B2 | 5/2011 | Xiao et al. | |
| 7,955,870 B2 | 6/2011 | Ditizio | |
| 7,985,667 B2 | 7/2011 | Cho | |
| 7,989,224 B2 | 8/2011 | Gaidis | |
| 2004/0087166 A1* | 5/2004 | Morrow | 438/694 |
| 2007/0155027 A1* | 7/2007 | Ditizio | 438/3 |
| 2008/0242074 A1* | 10/2008 | Lee | 438/594 |
| 2010/0181654 A1 | 7/2010 | Fujiwara et al. | |
| 2010/0219538 A1* | 9/2010 | Kito et al. | 257/786 |
| 2010/0240151 A1* | 9/2010 | Belen et al. | 438/3 |
| 2011/0254112 A1* | 10/2011 | Yamanaka et al. | 257/421 |
| 2012/0028373 A1* | 2/2012 | Belen et al. | 438/3 |

* cited by examiner

*Primary Examiner* — Scott B Geyer
(74) *Attorney, Agent, or Firm* — G. Marlin Knight (57) ABSTRACT

Various embodiments of the invention relate to etching processes used in fabrication of MTJ cells in an MRAM device. The various embodiments can be used in combination with each other. The first embodiment adds a hard mask buffer layer between a hard mask and a top electrode. The second embodiment uses a multilayered etching hard mask. The third embodiment uses a multilayered top electrode structure including a first Cu layer under a second layer such as Ta. The fourth embodiment is a two-phase etching process used for the bottom electrode to remove re-deposited material while maintaining a more vertical sidewall etching profile. In the first phase the bottom electrode layer is removed using carbonaceous reactive ion etching until the endpoint. In the second phase an inert gas and/or oxygen plasma is used to remove the polymer that was deposited during the previous etching processes.

6 Claims, 10 Drawing Sheets

MRAM ETCHING PROCESSES

FIELD OF THE INVENTION

The disclosure is related to a semiconductor memory and its fabrication process, particularly to a memory element of MRAM (Magnetic Random Access Memory).

BACKGROUND OF THE INVENTION

The Back-End-Of-Line (BEOL) memories such as RRAM (Resistive Random Access Memory), PRAM (Phase Change Random Access Memory), MRAM have a resistive memory element that provides high speed access and non-volatility at power off. The memory cell includes a top electrode, a bottom electrode and the resistive memory element in between. The bottom electrode is connected to a control device such as a transistor or a diode. After the layers of the memory device have been patterned, the top electrode is connected to a bit line in a series of process steps collectively referred to as BEOL process which creates metal interconnect wires that are insulated by dielectric material.

A Magnetic Tunnel Junction (MTJ) resistive element for MRAM includes a free layer, a fixed layer and a barrier layer in between. A magnetic moment of the free layer is manipulated to be parallel or antiparallel to the fixed layer by applying an electric current. Whether the magnetic vector of the free layer is parallel or antiparallel to the fixed layer determines the low or high resistance state of the MTJ, which are defined as memory state "0" or "1".

In published US patent application 20100181654 by Fujiwara, et al. (Jul. 22, 2010) an insulating film, which will be called a borazinic film herein, for a semiconductor device is described. The film is described as having low permittivity, a low leak current, high mechanical strength, stability over time, and excellent water resistance. The process for forming the film uses a carrier gas and a raw material gas, which has borazine skeletal molecules. The insulating film includes cross-linked borazine skeletal molecules and is said to have both inorganic or organic properties. A borazinic film suitable for general MRAM applications can be deposited by a CVD system such as the MAPLE (Multi Application PLasma Equipment) CVD system of Mitsubishi Heavy Industries.

After the stack of layers for the bottom electrode, the MTJ element and the top electrode have been deposited over the wafer, pads of hard mask material are formed over the selected areas for the memory cells to protect them during the etching process which forms pedestals by cutting through the entire layer stack. The present invention is directed at solving problems with the prior art etching process used to fabricate the MTJ cell pedestals.

The first issue is that a surface of the top electrode is passivated by the hard mask etchant. Once a passivation layer is formed on the surface, it affects the following top electrode etching process. It may slow the etching or may generate uniformity issues.

The second issue is top electrode erosion. Process margin for interconnecting to the bit line increases with a thickness of the top electrode. Conventional etching hard mask materials such as SiO2, Si3N4 do not have enough selectivity during MTJ cell fabrication. During the etching cycle that goes through the top electrode layer and down to the bottom electrode layer, the hard mask over the selected top electrode area is severely eroded and can be totally removed before completing the etching cycle. When the previously masked top electrode area is exposed to the etching ambient undesirable erosion occurs. Sometimes the erosion can penetrate through the top electrode to reach to the critical MTJ layers damaging the cell.

The 3rd issue is CD (critical dimension) control of MTJ stack including the electrodes. A straight sidewall profile is preferred to control the dimensions. The conventional hard mask is generally thickened to keep sufficient thickness of the top electrode for interconnect process. It requires thick photoresist to make a thick hard mask pattern, which results in a trade-off of resolution versus the thickness. The thick hard mask results in tapered sidewall shape.

The 4th issue is re-deposition during the etching cycle. Carbonaceous reactive ion etching provides a good profile of MTJ but tends to produce undesirable polymers and inhibits the following interconnecting process. It also creates a concern about reacting with the memory element and degrading the functionality. Though carbon-free etching such as ion milling produces no carbonaceous polymer, MTJ materials are re-sputtered on the sidewall which shorts the MTJ. In addition, ion milling is not preferred for fine patterning because incident angle of the ion beam to a wafer is tilted to maximize etching efficiency.

Any re-deposition materials should somehow be removed by end of the etching cycle. This disclosure provides solutions for the MTJ fabrication problems described above.

SUMMARY OF THE INVENTION

Embodiments of the invention include an etching process used in fabrication of MTJ cells in an MRAM (magnetic random access memory) device. The process uses etching hard masks structures deposited over the top electrodes and includes solutions to the problem of re-deposition during the etch process. The various embodiments can be used in combination with each other.

The first embodiment adds a hard mask buffer layer between a hard mask and a top electrode. The hard mask buffer layer prevents the surface of the top electrode from being passivated by the hard mask etchant. Once it is passivated, the surface of the top electrode resists etching. The hard mask etching process is allowed to continue until about half of the thickness of the buffer layer has been removed to avoid exposing the surface of the top electrode to the etching ambient. The material for the buffer layer is preferably selected so that the etching ambient that is used for etching the top electrode layer will also remove the exposed buffer material. The preferred materials for the buffer layer are silicon nitride, silicon carbide and their substitutes, which can be used in combination with a tantalum (Ta) top electrode.

The second embodiment uses a multilayered etching hard mask including a layer having a good selectivity (low etch rate) in an ambient used for top electrode or hard mask etching. A conventional hard mask layer material such as silicon oxide, silicon nitride, titanium nitride and their substitutes is selected for the first hard mask layer. The second hard mask layer is preferably a material having a slow etching rate in the hard mask or top electrode etching ambient such as a carbon fluoride system. Preferred materials include a borazinic film, aluminum oxide, copper, and aluminum, which have high selectivity compared to silicon oxide in the selected etching system. This embodiment works with Ta as a top electrode material. The second hard mask pad helps the Ta etching process by maintaining the thickness of the first hard mask pad. As a further benefit, the straight sidewall profile of the first hard mask pad and electrode is maintained since the selectivity of the second hard mask is good.

The third embodiment uses a multilayered top electrode structure including a first Cu layer under a second layer such as Ta. Using the Ta/Cu embodiment compensates for high etch rate of Cu in the MTJ etching ambient. In this embodiment the total top electrode thickness is increased to widen a process window of the bitline interconnection process. As an option, a passivation layer may be deposited after the bottom electrode has been etched to prevent MTJ from oxidation.

The fourth embodiment is a two-phase etching process is used for the bottom electrode to remove re-deposited material while maintaining a more vertical sidewall etching profile. In the first phase the bottom electrode layer is removed using carbonaceous reactive ion etching until the endpoint. In the second phase an inert gas and/or oxygen plasma with electrical bias is used to remove the polymer that was deposited during the previous etching processes.

DESCRIPTION OF THE INVENTION

First Embodiment

Figure 1:
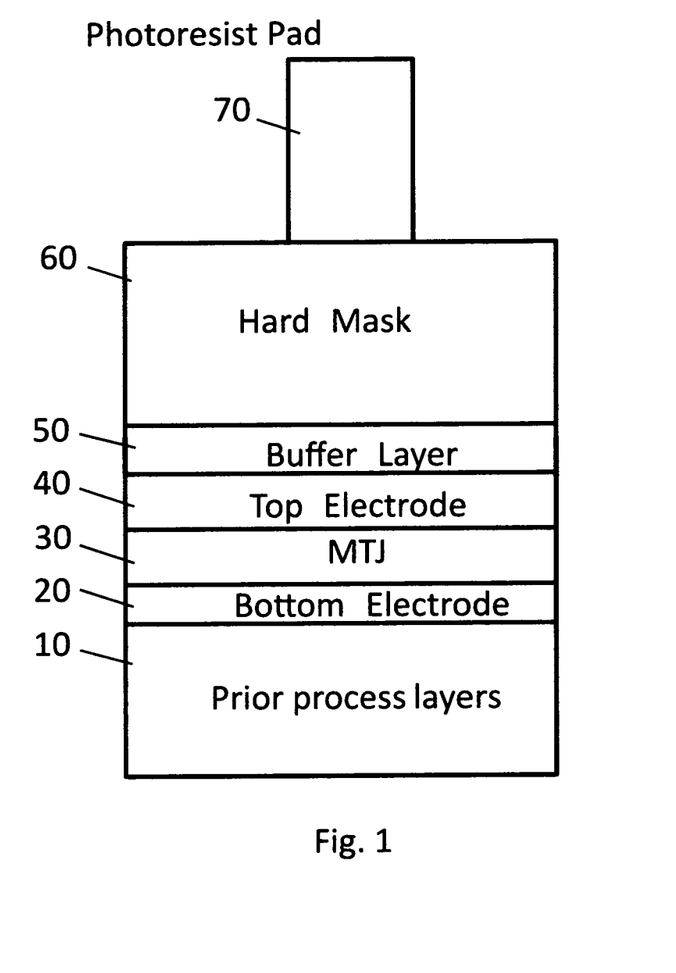
FIGS. 1 and 2 illustrate cross sectional views of layers in an MTJ cell at selected stages of a fabrication process according to the first embodiment of the invention.
Figure 2:
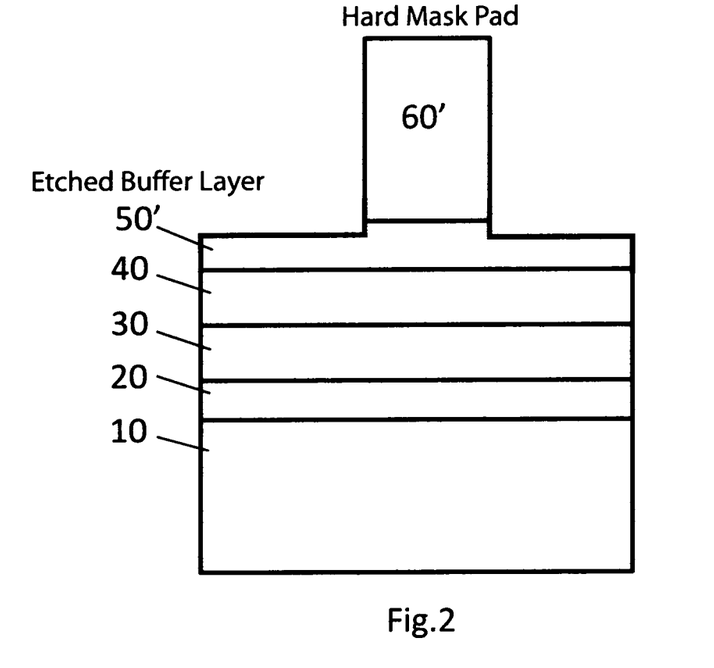

FIG. 1 and FIG. 2 will be used to describe the first embodiment of the invention. As shown in cross section in FIG. 1, the fabrication process has previously deposited the various thin film layers shown, and a photoresist pad 70 which typically include a bottom antireflective coating (BARC) polymer layer, has been patterned over the selected area. As shown in FIG. 1, a bottom electrode layer 20, an MTJ layer stack 30, a top electrode layer 40, a hard mask buffer layer 50 and a hard mask layer 60 are deposited sequentially. In this embodiment hard mask buffer layer 50 is inserted between a hard mask 60 and top electrode layer 40 to prevent the top electrode surface from being exposed to the etching ambient used to etch the hard mask. To reduce processing steps, the material for buffer layer 50 is selected so that it can be removed by top electrode etching ambient. The preferred materials for the buffer layer 50 are silicon nitride, silicon carbide and their substitutes. A conventional hard mask layer material such as silicon oxide, silicon nitride, titanium nitride and their substitutes is selected for the hard mask layer 60. A photoresist mask pad 70 is patterned on the hard mask layer 60. Although only one cell is shown in the figures, each of the embodiments of method according to the invention may used for the simultaneous fabrication of a many cells on a wafer according to standard techniques.

FIG. 2 illustrates a subsequent stage in the process after vertical dry etching has been performed on the structure shown in FIG. 1 and after the photoresist mask pad has been stripped. From the stage shown in FIG. 1, etching away the portion of the hard mask layer 60 not protected by the photoresist mask pad 70 forms hard mask pad 60' and thins the exposed area of buffer layer 50 (e.g. to about 50% of the original thickness) to form etched buffer layer 50'. The etching process is stopped at about half way through buffer layer 50 to avoid exposing the surface of the top electrode 40 to the etching ambient. The protection provided by the buffer layer prevents the surface of the top electrode from being passivated by the hard mask etchant. Once it is passivated, the surface of the top electrode resists etching.

From the stage shown in FIG. 2, the remainder of the fabrication process is executed in a conventional manner. Because the material for buffer layer 50 is selected so that it can be removed by top electrode etching ambient, the top electrode etching process will also remove the exposed material in etched buffer layer 50', and no additional process steps are required. For example, if the top electrode is tantalum (Ta) and silicon nitride is used as a buffer layer, then CF4, CH3F, CF4/O2 or Cl2/BCl3 chemistry etches both layers. The dielectric hard mask pad 60' and the buffer pad left 50' on top of the top electrode pad are generally removed during following MTJ etching or bottom electrode etching. Even if they still remain after bottom electrode etching, they are removed during the interconnect process.

Second Embodiment

Figure 3:
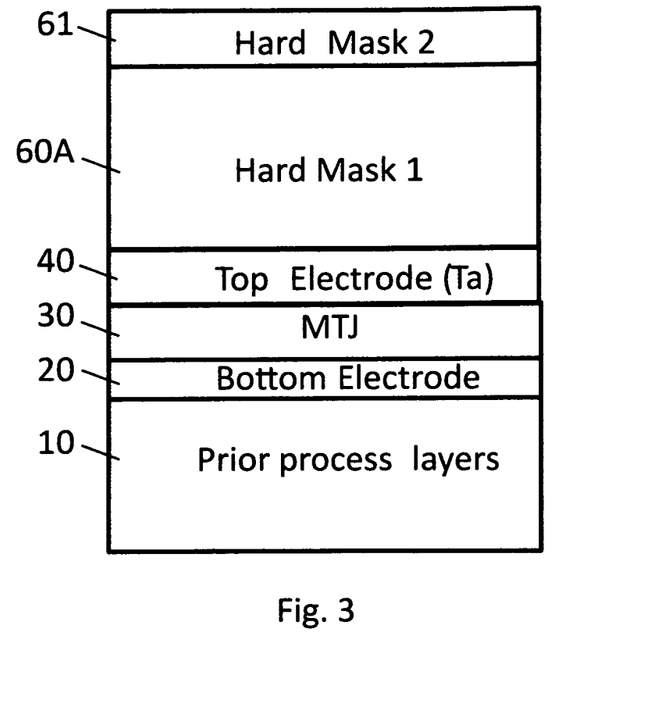
FIGS. 3 and 4 illustrate cross sectional views of layers in an MTJ cell at selected stages of a fabrication process according to the second embodiment of the invention.
Figure 4:
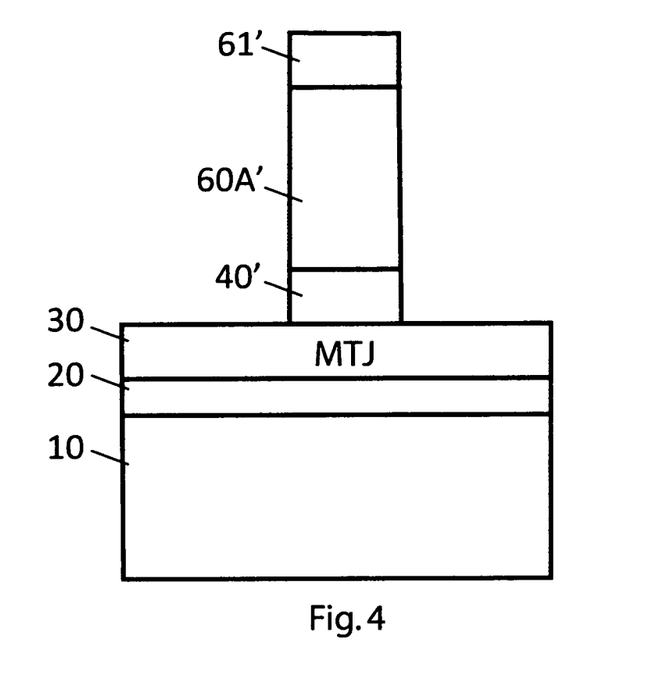

FIGS. 3 and 4 illustrate cross sectional views of layers at selected stages of a fabrication process of an MTJ cell according to the second embodiment of the invention. A layer stack structure of the second embodiment is shown in FIG. 3 prior to etching. As in the first embodiment there are two etching processes in this embodiment: a first etch to pattern the hard mask pads and a second etch to pattern the top electrode. Each of these etch processes uses a different etching ambient.

The bottom electrode layer 20, which is deposited over prior process layers 10, is followed by the MTJ layer stack 30, the top electrode layer 40, a first hard mask layer 60A and a second hard mask layer 61. A conventional hard mask layer material such as silicon oxide, silicon nitride, titanium nitride and their substitutes is selected for the first hard mask layer 60A. The second hard mask layer 61 is preferably a material having a low etching rate in the hard mask and/or top electrode etching ambient such as a carbon fluoride system. Preferred materials include a borazinic film, aluminum oxide, copper, and aluminum, which have high selectivity compared to silicon oxide in the etching system. The selectivity of each material is larger than 10.

The two-layer hard mask system also works when tantalum (Ta) or tantalum nitride (TaNx where x is typically below 0.1) is used as the top electrode material, which is common. FIG. 4 illustrates the stage of the process after the first and second hard mask pads 60A', 61' have been patterned and the exposed Ta has been etched away to form the top electrode 40'. The second hard mask pad 61' helps the Ta etching process by maintaining the thickness of the first hard mask pad 60A', as shown in FIG. 4. As a further benefit, the straight sidewall profile of the first hard mask pad 60A' and electrode 40' is maintained since the selectivity of the second hard mask is so good.

Figure 5:
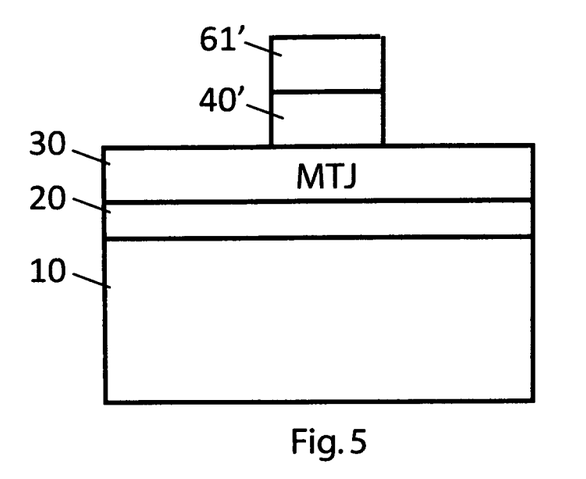
FIG. 5 illustrates a cross sectional view of layers in an MTJ cell at a selected stage of a fabrication process according to an alternative of the second embodiment of the invention.

FIG. 5 illustrates an alternative of the second embodiment, in which the second mask layer 61 as described above is directly deposited on the top electrode and the first hard mask as described above is omitted. However, the second hard mask pad 61' does not always have good selectivity in MTJ etching ambient, which is generally CH3OH system. For example, if copper is used for the second mask layer 61, the etch rate of copper in the CH3OH system is 2-7× faster than MTJ component materials, so the copper layer is rapidly removed in CH3OH system. As a result the top electrode (Ta) is exposed in the ambient and loses thickness. The third embodiment described below prevents for the Ta thickness loss.

Third Embodiment

Figure 6:
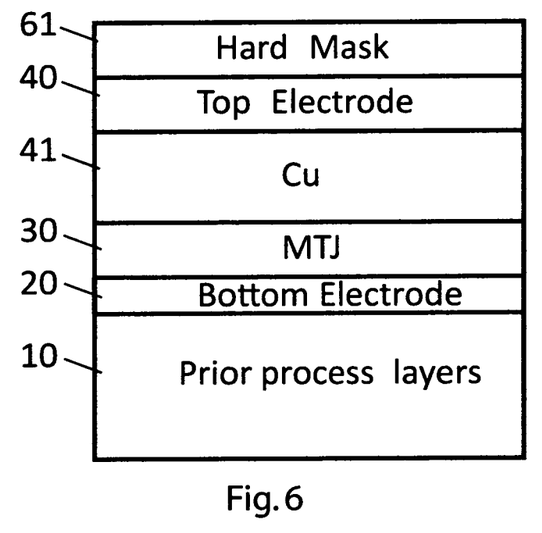
FIGS. 6 and 7 illustrate cross sectional views of layers in an MTJ cell at selected stages of a fabrication process according to the third embodiment of the invention.
Figure 7:
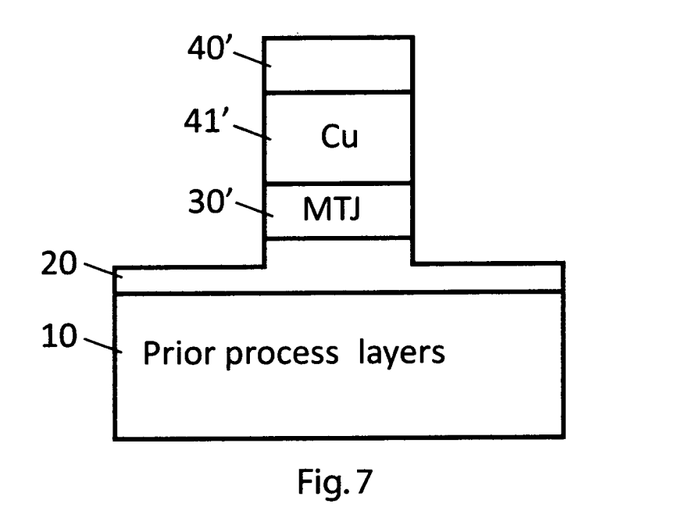
Figure 8:
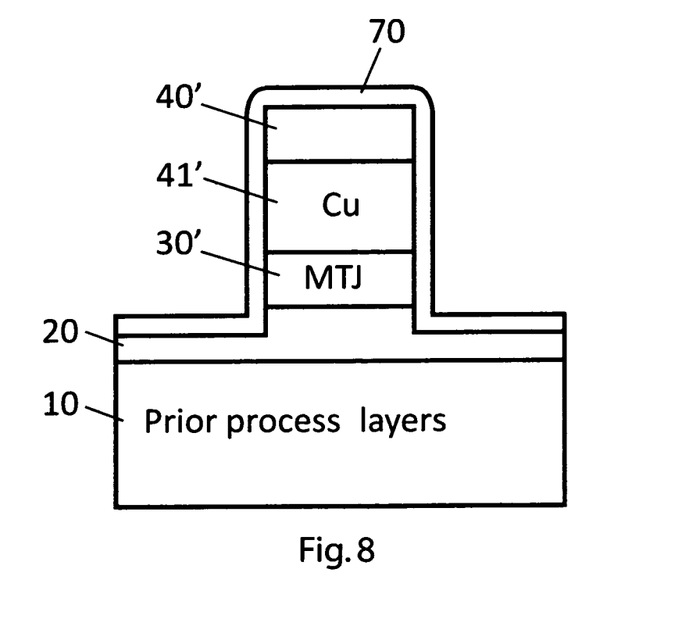
FIG. 8 illustrates a cross sectional view of layers in an MTJ cell at a selected stage of a fabrication process according to an alternative of the third embodiment of the invention in which a passivation layer is deposited.

In the third embodiment, the top electrode structure includes two layers: a first top electrode layer 41 of Cu is deposited on the MTJ 30 before the second top electrode layer 40 of a selected metal as shown in FIG. 6. The second top electrode layer 40 can be tantalum (Ta). Using the Ta/Cu embodiment compensates for high etch rate of Cu in MTJ etching ambient. The total top electrode thickness is increased to widen a process window of interconnection process. A photolithography process as described above creates a photoresist pad (not shown) which is followed by etching the second hard mask 61, etching the second top electrode layer 40, etching the first top electrode (Cu) layer 41, etching MTJ 30 and etching half way through the thickness of bottom electrode 20 as shown in FIG. 7. As an option, passivation layer 70 may be deposited to prevent MTJ from oxidation as shown in FIG. 8. From either the stage of FIG. 7 or 8, the standard bottom electrode etching process follows.

Fourth Embodiment

Figure 9:
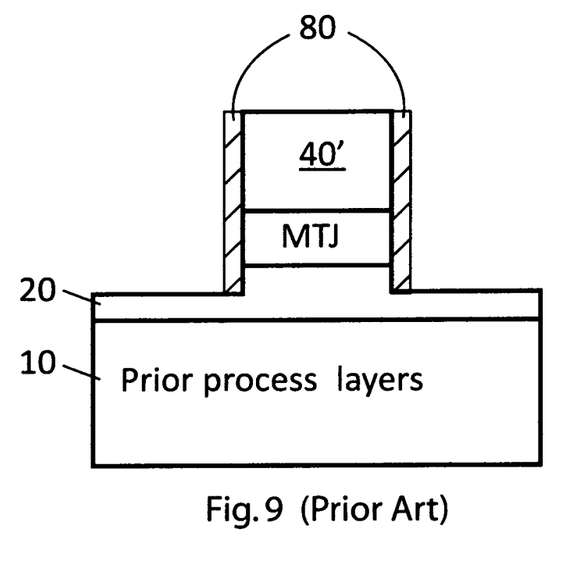
FIG. 9 illustrates a cross sectional view of layers in an MTJ cell at a selected stage of a fabrication process according to the prior art in which undesirable polymer material has been deposited on the sidewalls during an etching process using a carbonaceous gas.

FIG. 9 illustrates a problem with the prior art carbonaceous reactive ion etching process in which undesirable polymer material 80 has been deposited on the sidewalls during the MTJ etching process. The stage illustrated is after MTJ etch and prior to bottom electrode etch and shows lightly deposited polymer 80 on the sidewalls of top electrode 40', MTJ 30' and the pedestal portion of the bottom electrode 20. The carbonaceous reactive ion process provides a good vertical profile for the MTJ but tends to produce undesirable polymers that inhibit the subsequent interconnecting process. It also creates a concern about reactions with the MTJ memory element and degrading the functionality. Although a carbon-free etching process such as ion milling produces no carbonaceous polymer, it has the drawback that MTJ materials are re-sputtered on the sidewall which shorts the MTJ. In addition, ion milling is not preferred for fine patterning because the incident angle of the ion beam to the wafer surface is tilted away from perpendicular to maximize etching efficiency. The embodiment described in this section provides solutions for the MTJ fabrication problems described above and removes any re-deposition materials by end of the etching cycle.

Figure 10:
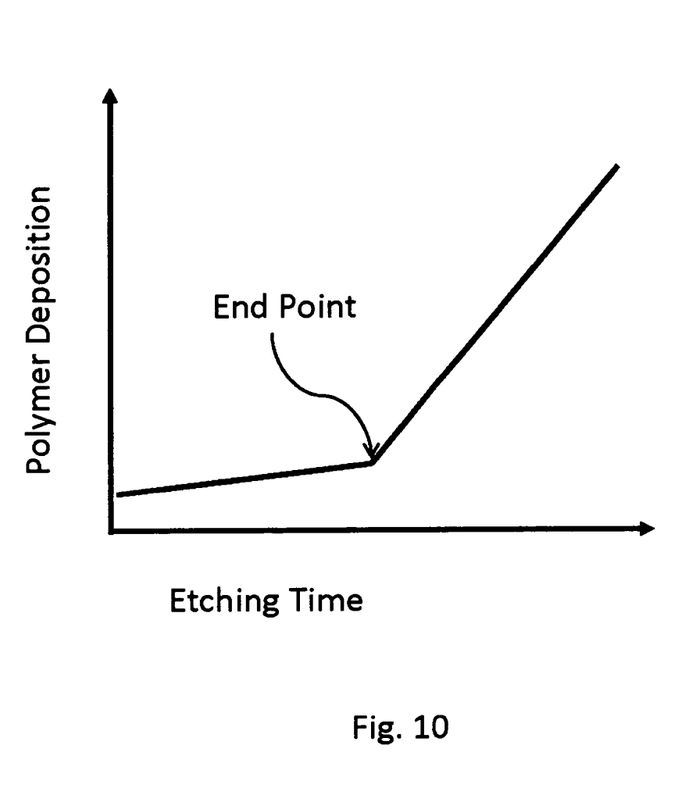
FIG. 10 is a graph of the polymer deposition versus etching time used to describe a fabrication process according to the fourth embodiment of the invention.
Figure 11:
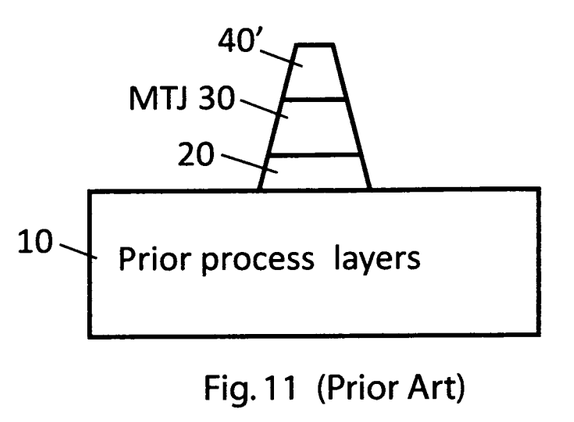
FIG. 11 illustrates the undesirable sloped sidewall profile that results from using an inert gas ambient for MTJ etching according to the prior art.

During bottom electrode etching, polymer deposition is very slow, but once the etching reaches the surface of layer 10 (which is the desired end-point), the polymer deposition rate rapidly increases as shown in FIG. 10. The reason for the increase is that the surface of layer 10 is typically a silicon containing material such as silicon dioxide or silicon nitride. Silicon containing radicals produced by the reactive ion etching are easily polymerized with other silicon and carbon containing radicals. Inert gas plasma etching such as argon (Ar) physically removes the polymer but also physically etches every other exposed material including the sidewalls of the MTJ. Because the inert gas plasma etching is not directional, it produces a sloped sidewall profile of the MTJ pedestal as shown in FIG. 11.

Figure 12:
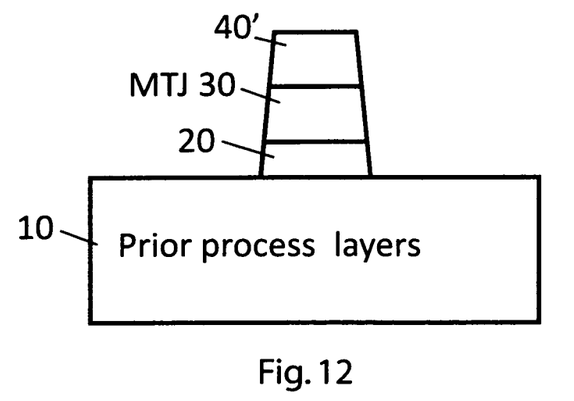
FIG. 12 illustrates a cross sectional view of layers in an MTJ cell at a selected stage of a fabrication process according to the fourth embodiment of the invention.

The fourth embodiment described in this section provides a solution for the MTJ fabrication problems described above by separating the bottom electrode layer etching process in two phases. In the first phase the bottom electrode layer is etched using carbonaceous reactive ion etching until the endpoint. The carbonaceous ambient is then flushed from the system. In one embodiment the second phase uses an inert gas such as Ar to physically remove the polymer that was deposited during the first phase. RF (radio frequency) power is generally applied to a wafer chuck to create a DC bias between the plasma and the wafer. The electrical bias drives ions in the plasma to the wafer and promotes physical etching. This etching sequence achieves a reasonable etching profile with polymer free sidewalls as shown in FIG. 12.

The second phase may alternatively use oxygen with bias power along with or instead of the inert gas. While a conventional oxygen ashing process is popularly adapted to clean up the etching surface, it does not always work well since the ashing is chemical etching with O2 radicals which are not activated enough to cut strong bonds in the polymer. However, the O2 radical is activated by the bias power sufficiently to remove the polymer. A mixture of oxygen and inert gas also works to remove the polymer.

The endpoint of the first etching phase should occur when the unmasked portion of the bottom electrode layer has been sufficiently removed. Any method of estimating when this occurs or detecting it directly can be used. One way is to set the switching point using an empirically determined fixed etch time. The etch rate is measured in advance in experiments and the etching time is calculated. A second way of determining when to switch to the second etching phase is using an endpoint detection system. When a target film such as the bottom electrode layer has been completely removed and the underlying surface is exposed, there are detectable changes in the plasma composition and in the optical properties of the visible surface. Thus, for example, end of phase one etching can be determined by monitoring a specific wave length of light associated with fluorescence of a particular atom in the plasma. The polarization and interference of reflected light from the surface can also be used to recognize the change of the optical properties of the surface when the bottom electrode layer is removed.

Every embodiment of the invention can be used separately from the other embodiments, but each embodiment can be combined with other embodiments. For example, the two-phase etching process of the fourth embodiment can be used along with embodiments one through three. For example, the hard mask buffer layer can be used with the two-layered hard mask of the second embodiment and/or with the additional Cu layer in the top electrode as described in the third embodiment.

The invention claimed is:

1. A method of fabricating a memory cell comprising:
depositing a stack of layers for a memory device including a memory element and a bottom electrode;
depositing a top electrode layer;
depositing a first hard mask layer over the top electrode layer;
depositing a second hard mask layer over the first hard mask layer, the second hard mask layer being a material having a low etching rate in a selected top electrode etching ambient;

patterning a photoresist pad on a selected location on the second hard mask layer leaving an exposed area;

performing a first etching process using a selected hard mask etching ambient to remove exposed areas of the first and second hard mask layers; and performing a second etching process using the selected top electrode etching ambient to remove exposed areas of the top electrode layer.

2. The method of claim 1 wherein the selected hard mask etching ambient is a carbon fluoride system.

3. The method of claim 1 wherein the first hard mask layer is silicon oxide, silicon nitride, or titanium nitride.

4. The method of claim 1 wherein the second hard mask layer is a borazinic film, aluminum oxide, copper, or aluminum.

5. The method of claim 1 wherein the first top electrode layer is tantalum.

6. The method of claim 1 wherein depositing the top electrode layer further comprises:

depositing a first top electrode layer of copper on an upper layer of the memory element; and depositing a second top electrode layer of a selected metal other than copper on the first top electrode layer.

* * * * *